United States Patent [19]
Johnson

[11] 3,983,516
[45] Sept. 28, 1976

[54] LONGITUDINAL-MODE MECHANICAL BANDPASS FILTER

[75] Inventor: Robert A. Johnson, Tustin, Calif.

[73] Assignee: Rockwell International Corporation, El Segundo, Calif.

[22] Filed: Aug. 25, 1975

[21] Appl. No.: 607,725

[52] U.S. Cl. .................................. 333/71; 333/72
[51] Int. Cl.² .................... H03H 9/04; H03H 9/26
[58] Field of Search ............ 333/71, 72; 310/8, 8.1, 310/8.2, 8.3, 8.6, 9.1

[56] References Cited
UNITED STATES PATENTS

| | | | |
|---|---|---|---|
| 2,814,785 | 11/1957 | Burns, Jr. | 333/72 |
| 3,142,027 | 7/1964 | Albsmeier et al. | 333/72 |
| 3,146,415 | 8/1964 | Albsmeier et al. | 333/72 |
| 3,792,382 | 2/1974 | Guenther | 333/72 |

*Primary Examiner*—Alfred E. Smith
*Assistant Examiner*—Marvin Nussbaum
*Attorney, Agent, or Firm*—Howard R. Greenberg; Robert J. Crawford

[57] ABSTRACT

A mechanical bandpass filter employs bar resonators operated in a longitudinal mode of vibration which are aligned in parallel array along their longitudinal axes by rigidly joining them together with at least two support rods at their aligned nodal planes, the number and location of nodal planes being determined by operating the filter in a bandpass frequency range which corresponds to one of the harmonic longitudinal-mode resonant frequencies. Piezoelectric transducers affixed to the longitudinal surfaces of two resonators provide means for mechanically driving the resonator assembly from an electrical input signal and for extracting an electrical output signal.

5 Claims, 2 Drawing Figures

LONGITUDINAL-MODE MECHANICAL BANDPASS FILTER

BACKGROUND OF THE INVENTION

The invention herein pertains generally to mechanical bandpass filters and specifically to a mechanical filter which employs bar resonators operated in a longitudinal mode of vibration to achieve a narrower bandpass frequency range than previously attainable with prior art mechanical filters.

Although mechanical bandpass filters are well known and are extensively used commercially in electronic circuits, their application for narrow bandwidth operation has been somewhat limited because of inherent problems, such as high insertion loss and passband rounding, engendered by some of the transduced mechanical energy being diverted to the structural supports away from the output transducer stage. In addition, specific types such as conventional disk-wire designs require a high degree of resiliency (wire compliance) in order to achieve narrow bandwidths, so that as the ruggedness of the device is diminished to achieve greater selectivity a point is reached when the structure is too fragile to withstand the forces normally encountered in a commercial environment. These filters are typically capable of minimum bandwidths of about 0.1% of the center frequency. Bar-flexure designs suffer from the inaccessibility to the singular nodal point for support purposes so that some of the transduced mechanical energy must inherently be dissipated through the structural supports thereby reducing the attainable Q levels and consequently the degree of selectivity. The bandwidth for these devices generally exceeds 0.2% of the center frequency.

The longitudinal-mode of resonant response wherein a bar resonator vibrates along its longitudinal axis is a well known and understood phenomenon. However, although longitudinal-mode resonators, such as the Langevin type, comprising two columnar metal rod sections separated by a piezoelectric transducer (see *Modern Filter Theory and Design* by Temes and Metra, p. 175) have been employed in mechanical bandpass filters such as the tandem type described in an article entitled "The Mechanical Filter: Evaluation to Technical Maturity" which appeared in the June 1973 issued of Japan Electric Engineering, the realizable bandwidths do not even compare with those of the aforementioned filters (the article indicating a minimum bandwidth of 0.2% of center frequency).

With the foregoing in mind, it is a primary object of the present invention to provide a new and improved mechanical bandpass filter.

It is a further object of the present invention to provide such a filter which advantageously employs the longitudinal mode of vibrational response for bar resonators.

It is still a further object of the present invention to provide such a filter which exhibits a narrower bandwidth than previously attainable with prior art mechanical filters.

The foregoing objects as well as others, and the means by which they are achieved through the present invention, may be best appreciated by referring to the Detailed Description of the Invention which follows hereinafter together with the figures.

BRIEF DESCRIPTION OF THE INVENTION

In accordance with the stated objects, the mechanical bandpass filter of the invention is constructed with a plurality of bar resonators which are arranged in parallel array along their longitudinal axes. The resonators are rigidly joined together by at least two support rods connected at their aligned nodal planes, the number and location of the nodal planes being determined by operating the filter in a bandpass frequency range which corresponds to one of the harmonic longitudinal mode resonant frequencies of the resonators. Since no resonator movement takes place at these nodes during vibration, no transduced mechanical energy is lost through the support structure in which the support rods are seated. A piezoelectric transducer affixed to a longitudinal surface of one of the resonators receives the electrical input signal to mechanically drive the associated resonator, while a second piezoelectric transducer is affixed to a longitudinal surface of another resonator to provide an electrical output signal. Acoustic coupling is provided by a wire coupling means which joins the resonators at a point other than the nodes to transmit the transduced mechanical energy from one resonator to the next.

The first embodiment described is addressed to a simple filter employing only two resonators, while the second embodiment depicts a filter having more than two resonators for achieving greater selectivity.

DETAILED DESCRIPTION OF THE INVENTION

Figure 1:
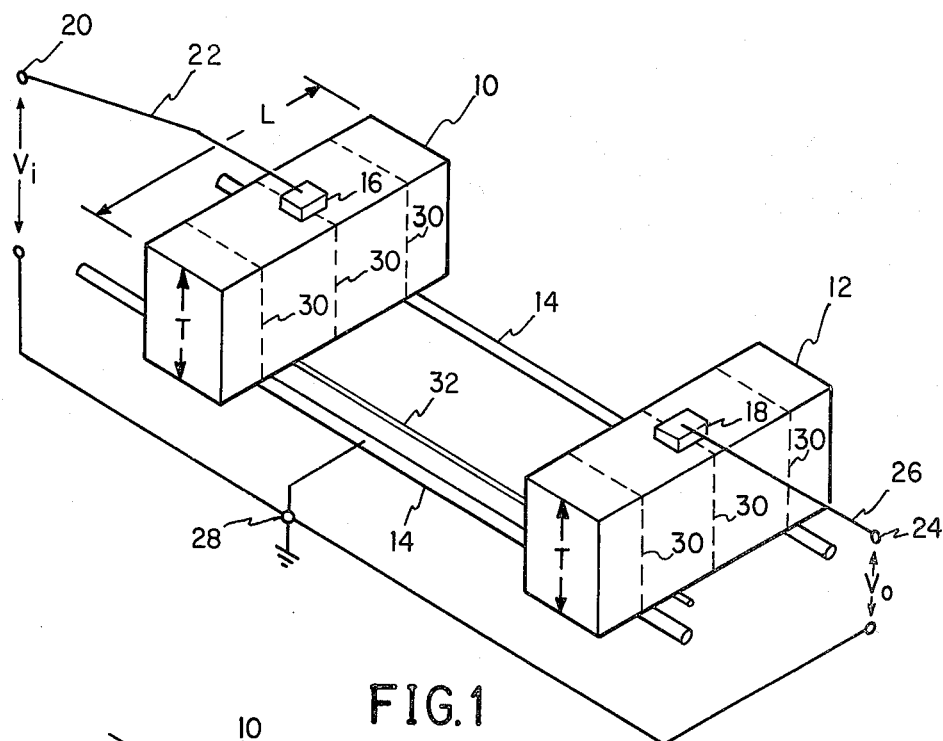
FIG. 1 is an isometric view of the first embodiment of the invention which entails the use of two resonators.

As shown in FIG. 1, the mechanical bandpass filter of the invention comprises a pair of bar resonators 10 and 12, each having a length L in the longitudinal direction and a thickness T in the vertical direction and being fabricated from a suitable metallic alloy such as Ni-Span C. Resonators 10 and 12 are aligned in parallel array along their longitudinal axes by rigidly joining them together with two support rods 14 which are likewise arranged in parallel. As will be seen shortly, these rods 14 attach (through any desired means such as welding) to the resonators 10 and 12 along an edge of one of their nodal planes; viz. points which display no movement along the longitudinal axis when the resonators 10 and 12 are caused to vibrate in a longitudinal mode of response. The rods 14 would be seated in any appropriate manner such as by grommets (not shown) to support the resonator assembly in its intended environment.

A pair of piezoelectric transducers, metal plated on their two major surfaces, 16 and 18 are affixed, such as by soldering, to the longitudinal surfaces of resonators 10 and 12, respectively, their two major opposing surfaces (between which an electric field is applied) being parallel to the longitudinal surfaces. The exposed plated major surface of transducer 16 is connected to an input terminal 20 via lead wire 22 while the major surface of transducer 18 is connected to an output terminal 24 via lead wire 26. All electrical signals are referenced to a common ground terminal 28 which is connected to one of the support rods 14, which preferably being made of metal, thereby grounds resonators 10 and 12 as well as the unexposed major surfaces of transducers 16 and 18 which are contiguous with a longitudinal surface thereof. Consequently, when an input electrical signal $V_i$ is applied to terminal 20, an electric field is produced across the two major plated surfaces of transducer 16 causing it by virtue of the piezoelectric effect to contract and expand in accordance with the signal. Since transducer 16 is affixed to bar resonator 10, the latter is likewise forced to contract and expand, its movement being determined by the electrical signal $V_i$. Although there is flexural movement as well in the vertical direction, as will be seen shortly this unwanted mode of response can be materially attenuated.

As mentioned earlier, the longitudinal mode of response produces nodal planes transverse to the longitudinal axis in which no movement takes place. As is well known to those skilled in the art, the number and location of these nodal planes depend on the longitudinal resonant frequency $f_L$ with which the resonator is excited which is equal to $$\frac{\eta}{2L}\sqrt{\frac{E}{\rho}},$$

wherein L equals the length, E-Young's Modulus and $\rho$-the density of material for the bar and $\eta$-the order of harmonic resonant frequency with $\eta=1$ corresponding to the fundamental resonant frequency (see *Modern Filter Theory and Design*, Chapter 5). For example, at the fundamental resonant frequency of the resonator, there is a single nodal plane midway between the ends of the resonator along its longitudinal axis so that each half section elongates and contracts in the longitudinal direction together. Consequently, all points of the resonator exhibit longitudinal movement with the exception of those lying in the plane which bisects the resonator along its longitudinal axis. At the first harmonic resonant frequency (twice the fundamental) these are two nodal planes each being located one-quarter of the length L of the resonator from its ends. Assuming that the resonator 10 of FIG. 1 is excited by a frequency which corresponds to its second harmonic resonant frequency (three times the fundamental frequency), then there are three nodal planes 30, the distance from the middle nodal plane 30 to an adjacent nodal plane 30 being ⅓L and the distance from each end of the resonator 10 to the first nodal plane 30 being 1/6L.

Since the support rods 14 attach to resonators 10 and 12 at the nodal planes 30 wherein no movement occurs they cannot transmit any transduced mechanical energy resulting from the movement of resonator 10 since they themselves do not move. Consequently, when placed into a support structure, no transduced mechanical energy is dissipated thereto which would otherwise diminish the system Q. Mechanical energy is coupled from resonator 10 to resonator 12 by an acoustic coupling wire 32 which may be connected therebetween at any desired point other than the nodal planes. Thus, as resonator 10 vibrates longitudinally, coupling wire 32 flexes in accordance therewith causing resonator 12 to reproduce the longitudinal motion and transducer 18 to produce an electrical signal $V_o$ at terminal 24 indicative of the movement. As is well known, maximum coupling occurs when acoustic coupling wire 32 is placed midway between nodal planes 30. Also by using a coupling wire 32 of small diameter, a narrow bandwidth filter can be realized. As is known, the lower passband frequency of a mechanical bandpass filter is determined by the freely vibrating resonant frequency for the individual resonators when unassembled while the upper passband frequency is determined by the resonant frequency for the entire resonator assembly, which for narrowband operation will not be too different. In order to provide two nodal planes for accommodating at least two support rods 14 to produce an efficaciously sound structure, the mechanical filter should be designed for operation in a bandpass frequency range which corresponds to a harmonic longitudinal resonant frequency, with the first harmonic being the minimum (since the fundamental frequency produces only a single support nodal plane which could accommodate only one rod).

Since it is the longitudinal motion of the resonators 10 and 12 which conveys the desired information, it is desirable to keep the motion as longitudinally pure as possible which means attenuating the flexural mode response as much as practicable. This may be done in two ways. Since the flexural resonant frequency $f_f$ is (in contrast to the longitudinal mode) directly proportional to the thickness T of resonators 10 and 12 ($f_f = KT/L^2$ where K is a constant) by judiciously selecting its thickness value, the fundamental flexural resonant frequency and its harmonics can be chosen so as not to fall within or close to the passband frequency range of the filter. Also, by locating the piezoelectric transducers 10 and 12 midway between the ends of their respective resonators 10 and 12, nonsymmetric flexural modes of vibration are eliminated. Because the maximum electromechanical coupling occurs when the transducer is located over a nodal plane, the filter of FIG. 1 is operated in the range corresponding to its second harmonic which produces a nodal plane 30 in the center of the bar as shown over which to mount transducers 16 and 18.

It is to be noted that although impedance matching circuits are commonly used with mechanical filters for interfacing with the input and output terminating resistance they are not essential to the invention and therefore have not been shown herein. Also, the transducers 16 and 18 can be emplaced on the side longitudinal surfaces just as well as on the top as shown in order to accommodate packaging requirements and to afford design flexibility with respect to reducing the influence of flexural modes of vibration. A mechanical filter built in this manner exhibited a center frequency of 260 kHz with a 3 dB bandwidth of 110 Hz which is 0.04% of the center frequency. The narrowness of this bandwidth is more than 50% greater than presently attainable with other type mechanical filters.

Figure 2:
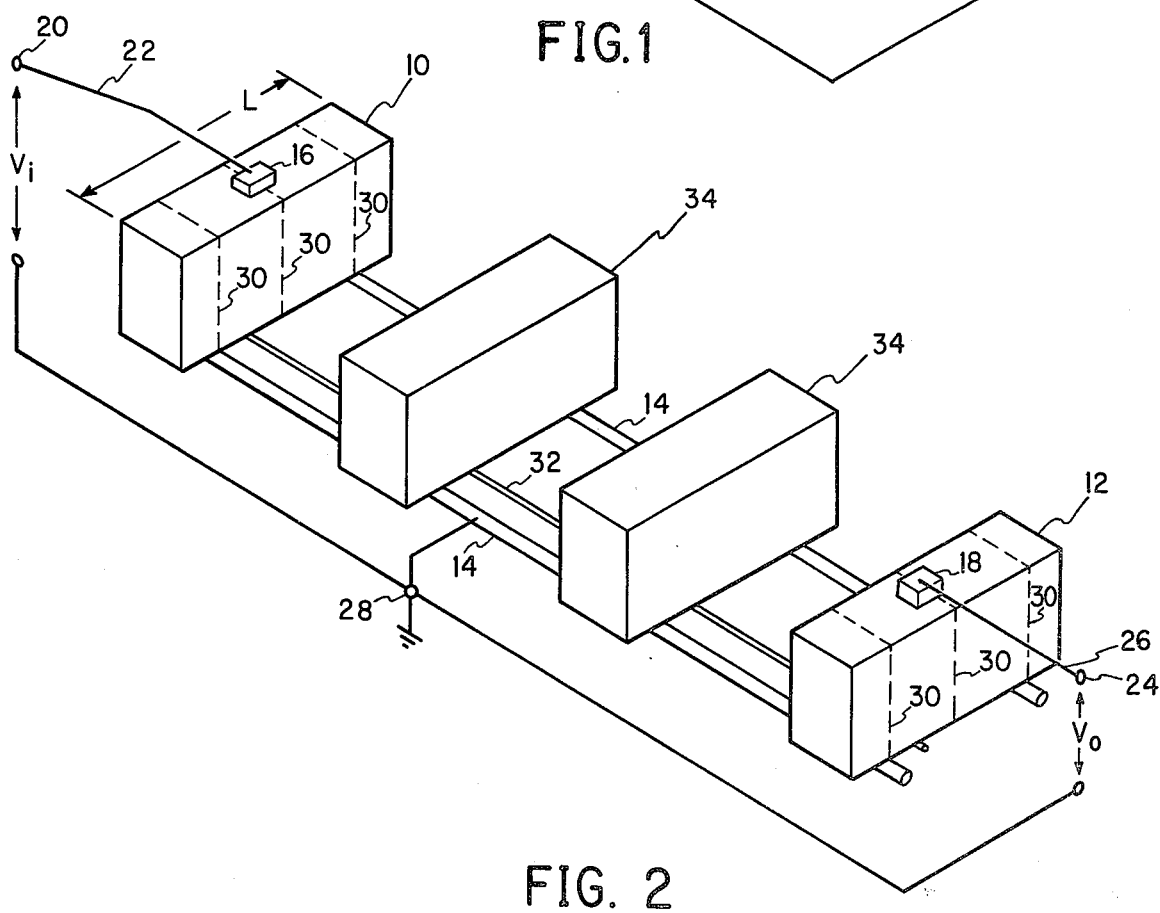
FIG. 2 is an isometric view of the second embodiment of the invention wherein more than two resonators are employed.

The embodiment of FIG. 2 is exactly the same as that of FIG. 1 except for the inclusion of additional resonators 34 between the outside resonators 10 and 12. Although resonators 34 are attached to the rods 14 and wire 32 the same as resonators 10 and 12, they have no piezoelectric transducers mounted thereon. As will be apparent to those skilled in the art, their sole function is to permit greater design latitude to achieve a higher selectivity.

As the foregoing demonstrates, the longitudinal-mode resonator assembly which comprises the invention affords a sturdily efficacious structure for withstanding the forces normally encountered in a commercial environment while avoiding the dissipation of transduced mechanical energy to permit narrower mechanical filter bandwidths to be realized than heretofore. Since modifications of the preferred embodiments will no doubt occur to those skilled in the art which would not constitute a departure from the scope and spirit of the invention, the foregoing detailed description is intended to be merely exemplary and not circumspective of the invention as will now be claimed hereinbelow.

What is claimed is:

1. A mechanical bandpass filter, comprising:
   at least two bar resonators, aligned in parallel array along their longitudinal axes;
   two piezoelectric transducers, each being affixed to a longitudinal surface of a different one of said resonators;
   at least two support rods for rigidly joining said resonators along their aligned nodal planes, the number and location of the nodal planes being determined by operating the filter in a bandpass frequency range which corresponds to a single one of the harmonic longitudinal-mode resonant frequencies for said resonators whereby the support rods lie in different nodal planes of the same resonator;
   coupling means for flexurally coupling said resonators;
   means for applying an electrical input signal to one of said transducers for mechanically driving its associated resonator, and
   means for extracting an electrical output signal from the other one of said transducers.

2. The filter of claim 1 wherein said coupling means is a wire connected to each resonator at a point between its nodal planes.

3. The filter of claim 1 wherein each of said transducers is located over a nodal plane.

4. The filter of claim 3 wherein said longitudinal-mode resonant frequency is an even harmonic of the fundamental and said transducers are located midway along the longitudinal axis of said resonators.

5. The filter of claim 1 including at least one additional bar resonator located intermediate said two bar resonators in aligned parallel array therewith and which is attached to said support rods and said coupling means.

* * * * *